(12) United States Patent
Lyu et al.

(10) Patent No.: US 11,758,697 B2
(45) Date of Patent: Sep. 12, 2023

(54) LOW INDUCTANCE POWER MODULE WITH VERTICAL POWER LOOP STRUCTURE AND INSULATED BASEPLATES

(71) Applicant: Ohio State Innovation Foundation, Columbus, OH (US)

(72) Inventors: Xintong Lyu, Columbus, OH (US); Jin Wang, Powell, OH (US)

(73) Assignee: OHIO STATE INNOVATION FOUNDATION, Columbus, OH (US)

(*) Notice: Subject to any disclaimer, the term of this patent is extended or adjusted under 35 U.S.C. 154(b) by 222 days.

(21) Appl. No.: 17/032,196

(22) Filed: Sep. 25, 2020

(65) Prior Publication Data

US 2021/0100128 A1   Apr. 1, 2021

Related U.S. Application Data

(60) Provisional application No. 62/906,253, filed on Sep. 26, 2019.

(51) Int. Cl.
```
H05K 7/20      (2006.01)
H05K 1/18      (2006.01)
H05K 1/02      (2006.01)
```

(52) U.S. Cl.
CPC .......... *H05K 7/209* (2013.01); *H05K 1/0204* (2013.01); *H05K 1/181* (2013.01); *H05K 2201/066* (2013.01)

(58) Field of Classification Search
CPC . H01L 2924/13055; H01L 2224/32225; H01L 23/473; H01L 2924/13091;

(Continued)

(56) References Cited

U.S. PATENT DOCUMENTS 5,574,630 A * 11/1996 Kresge .............. H01L 23/5384
                                                   257/E23.079
6,201,701 B1 * 3/2001 Linden .................. H05K 1/0206
                                                   361/720
(Continued)

FOREIGN PATENT DOCUMENTS

CN           105790592 A   *  7/2016
CN           110254247 A   *  9/2019
(Continued)

OTHER PUBLICATIONS

He et al. CN105790592 Jul 20, 2016, Espacenet English Translation (Year: 2016).*

(Continued)

*Primary Examiner* — Michael A Matey
(74) *Attorney, Agent, or Firm* — Meunier Carlin & Curfman LLC

(57) ABSTRACT

A low inductance power module with low power loop inductance and high-power density is provided. The power module may include a vertical power loop structure, a cooling layer, and a thermal dissipation structure. The vertical power loop structure may utilize a substrate bottom conduction layer for electrical conduction. The thermal dissipation structure may be disposed between the substrate bottom conduction layer and the cooling layer. The vertical power loop structure may include integrated decoupling capacitors. Alternatively, the structure may include no integrated decoupling capacitors. The vertical power loop structure may include one or more half-bridge structures connected in parallel, each with its own integrated decoupling capacitors. The vertical power loop structure reduces power loop inductance in the power module, and the thermal dissipation structure provides electrical insulation, mechanical support, and thermal conduction.

17 Claims, 7 Drawing Sheets

(58) Field of Classification Search
CPC .. H01L 2924/1305; H01L 2924/19041; H02M 7/003; H02M 1/0048; H02M 1/34; H02M 3/155; H05K 7/20927; H05K 1/0231; H05K 7/1432; H05K 1/0203; H05K 1/021; H05K 7/209; H05K 1/0204; H05K 1/181; H05K 2201/066
See application file for complete search history.

(56) References Cited

U.S. PATENT DOCUMENTS

| | | | | |
|---|---|---|---|---|
| 6,359,331 | B1* | 3/2002 | Rinehart | H01L 25/115 257/691 |
| 6,787,896 | B1* | 9/2004 | Petty-Weeks | H01L 23/3677 438/106 |
| 7,362,576 | B2* | 4/2008 | Takeda | H01L 23/345 257/E23.081 |
| 7,738,249 | B2* | 6/2010 | Chan | H05K 1/0272 428/209 |
| 9,106,124 | B2* | 8/2015 | Bayerer | H01L 25/162 |
| 9,472,488 | B2* | 10/2016 | Gohara | H01L 23/36 |
| 9,729,059 | B1* | 8/2017 | Parto | H02M 7/003 |
| 9,888,563 | B2* | 2/2018 | Bayerer | H05K 1/181 |
| 10,032,732 | B1* | 7/2018 | DiMarino | H05K 1/167 |
| 10,522,517 | B2* | 12/2019 | Tanimoto | H01L 25/07 |
| 10,756,057 | B2* | 8/2020 | Tanimoto | H01L 24/49 |
| 2002/0129974 | A1* | 9/2002 | Smith | H05K 1/0263 174/260 |
| 2004/0227231 | A1* | 11/2004 | Maly | H01L 25/072 257/E23.114 |
| 2008/0237847 | A1* | 10/2008 | Nakanishi | F28F 3/12 257/722 |
| 2010/0170221 | A1* | 7/2010 | Yoshida | F02K 3/075 60/226.3 |
| 2012/0139096 | A1* | 6/2012 | Gohara | H01L 23/3735 257/E23.101 |
| 2013/0264702 | A1* | 10/2013 | Nishi | H01L 23/3735 257/712 |
| 2014/0043765 | A1* | 2/2014 | Gohara | H01L 23/3735 361/699 |
| 2014/0063747 | A1* | 3/2014 | Sotome | H05K 7/209 361/720 |
| 2015/0116022 | A1* | 4/2015 | Hughes | H03K 17/04106 327/374 |
| 2016/0129792 | A1* | 5/2016 | Gohara | B60K 1/00 29/890.035 |
| 2016/0278211 | A1* | 9/2016 | Feng | H05K 1/0203 |
| 2016/0343641 | A1* | 11/2016 | Hori | H01L 25/072 |
| 2017/0012030 | A1* | 1/2017 | Wang | H01L 24/32 |
| 2017/0104477 | A1* | 4/2017 | Hughes | H01L 21/0242 |
| 2017/0271240 | A1* | 9/2017 | Inoue | H01L 23/473 |
| 2017/0331371 | A1* | 11/2017 | Parto | H02M 7/003 |
| 2018/0213676 | A1* | 7/2018 | Boteler | H02M 3/158 |
| 2018/0366400 | A1* | 12/2018 | Mohn | H01L 23/5383 |
| 2019/0067160 | A1* | 2/2019 | Xu | H01L 23/3735 |
| 2019/0287885 | A1* | 9/2019 | Joshi | H02M 3/158 |
| 2021/0111105 | A1* | 4/2021 | Kim | H02M 7/003 |

FOREIGN PATENT DOCUMENTS

| | | | | |
|---|---|---|---|---|
| CN | 212848395 U | * | 3/2021 | |
| EP | 1830406 A1 | * | 9/2007 | ........... H01L 23/473 |
| WO | WO-2018202620 A1 | * | 11/2018 | ........ H01L 23/49811 |
| WO | WO-2020263413 A1 | * | 12/2020 | ......... G01R 31/2896 |

OTHER PUBLICATIONS

B. McPherson, M. Schupbach, S. Seal, A. Dutta, B. Passmore, A. Lostetter, T. McNutt, J. Casady, "A Modular and Scalable High Performance Power Module for Silicon Carbide Devices," 2019 IEEE Applied Power Electronics Conference and Exposition (APEC), Anaheim, CA, Mar. 2019. 27 pages.

T. McNutt, K. Olejniczak, D. Martin and G. Moxey, "DC Bus Switching Performance as Determined by Commutation Loop Parasitics and Switching Dynamics," 2018 Power Electronics Europe, Issue 3. 3 pages. https://www.wolfspeed.com/downloads/dl/file/d/1233/product/0/dc_bus_switching_performance_as_determined_by_commutation_loop_parasitics_and_switching_dynamics.pdf.

Chen, Zheng, et al. "A 1200-V, 60-A SiC MOSFET multichip phase-leg module for high-temperature, high-frequency applications." IEEE Transactions on Power Electronics 29.5 (2013): 2307-2320.

C. DiMarino, W. Zhang, N. Haryani, Q. Wang, R. Burgos and D. Boroyevich, "A high-density, high-efficiency 1.2 kV SiC MOSFET module and gate drive circuit," 2016 IEEE 4th Workshop on Wide Bandgap Power Devices and Applications (WiPDA), Fayetteville, AR, 2016, pp. 47-52.

S. Guo, L. Zhang, Y. Lei, X. Li, W. Yu and A. Q. Huang, "Design and application of a 1200V ultra-fast integrated Silicon Carbide MOSFET module," 2016 IEEE Applied Power Electronics Conference and Exposition (APEC), Long Beach, CA, 2016, pp. 2063-2070.

M. Wang, F. Luo and L. Xu, "A Double-End Sourced Wire-Bonded Multichip SiC MOSFET Power Module With Improved Dynamic Current Sharing," in IEEE Journal of Emerging and Selected Topics in Power Electronics, vol. 5, No. 4, pp. 1828-1836, Dec. 2017.

F. Yang, Z. Wang, Z. Liang and F. Wang, "Electrical Performance Advancement in SiC Power Module Package Design With Kelvin Drain Connection and Low Parasitic Inductance," in IEEE Journal of Emerging and Selected Topics in Power Electronics, vol. 7, No. 1, pp. 84-98, Mar. 2019.

M. Olszewski, FY2011 "Evaluation of the 2010 Toyota Prius hybrid synergy drive system" Mar. 2011. 88 pages.

FS820R08A6P2, Infineon HybridPACK drive module. Final Data Sheet V3.3, Oct. 9, 2019. 16 pages. https://www.infineon.com/cms/en/product/power/igbt/automotive-qualifiedigbts/actomotive-igbt-modules/s820r08a6p2/.

FS770R08A6P2B, Infineon HybridPACK drive module. Final Data Sheet V3.0 May 28, 2019. 16 pages. https://www.infineon.com/cms/en/product/power/igbt/automotive-qualifiedigbts/actomotive-igbt-modules/fs770r08a6p2b/#.

D. Reusch and J. Strydom, "Understanding the Effect of PCB Layout on Circuit Performance in a High-Frequency Gallium-Nitride-Based Point of Load Converter," in IEEE Transactions on Power Electronics, vol. 29, No. 4, pp. 2008-2015, Apr. 2014.

Lyu, Xintong, et al. "Design of a Lightweight Low Inductance Power Module with Ceramic Baseplates." 2020 IEEE Applied Power Electronics Conference and Exposition (APEC). IEEE, Mar. 15-19, 2020. 6 pages.

* cited by examiner

LOW INDUCTANCE POWER MODULE WITH VERTICAL POWER LOOP STRUCTURE AND INSULATED BASEPLATES

CROSS-REFERENCE TO RELATED APPLICATIONS

This application claims the benefit of U.S. provisional patent application No. 62/906,253, filed on Sep. 26, 2019, and entitled "A LIGHTWEIGHT LOW INDUCTANCE POWER MODULE WITH INSULATED BASEPLATES," the disclosure of which is expressly incorporated herein by reference in its entirety.

BACKGROUND

In a conventional power module structure, the die is attached to the substrate. The substrate is usually constructed from an insulated material with a conduction layer on the top and bottom of the substrate. The conduction layer in the substrate may be copper or aluminum or an alloy directly bonded or brazed onto the insulation material. The top conduction layer provides electrical connections of semiconductor switches, capacitors, connection tabs and other electrical components that may be included. The substrate insulation material provides electrical insulation between the circuit and a cooling and mechanical support structure. Through the bottom conduction layer, the substrate is attached to the baseplate for mechanical support and heat-spreading. The baseplate material is usually electrically conductive, such as copper or aluminum or aluminum silicon carbide. Then the baseplate is pressed to a metal heatsink through thermal interface material for cooling. In this conventional design, the power loop stray inductance is large, and the layered structure from semiconductor dies to heatsink leads to relatively high thermal resistance. For medium voltage devices, the electric field inside the device package is difficult to control.

Under high current high-speed switching, voltage overshoot requires sufficient voltage margins of the power devices. Higher voltage rating devices result in additional cost, higher conduction losses and lower overall efficiency. The voltage overshoot and subsequent oscillation comes from the stored energy in the stray inductance of the power loop. Thus, power loop inductance reduction is critical for high switching speed high efficiency operation with low overshoot voltage.

It is with respect to these and other considerations that the various aspects and embodiments of the present disclosure are presented.

SUMMARY

A low inductance power module with low power loop inductance and high-power density is provided. The power module may include a vertical power loop structure, a cooling layer, and a thermal dissipation structure. The vertical power loop structure may utilize a substrate bottom conduction layer for electrical conduction. The thermal dissipation structure may be disposed between the substrate bottom conduction layer and the cooling layer. The vertical power loop structure may include integrated decoupling capacitors. Alternatively, the structure may include no integrated decoupling capacitors. The vertical power loop structure may include one or more half-bridge structures connected in parallel, each with its own integrated decoupling capacitors. The vertical power loop structure reduces power loop inductance in the power module, and the thermal dissipation structure provide electrical insulation, mechanical support and thermal conduction.

In an embodiment, a power module is provided. The power module may include: a vertical power loop structure comprising a substrate bottom conduction layer for electrical conduction; a cooling structure; and a thermal dissipation structure disposed between the substrate bottom conduction layer and the cooling structure.

Embodiments may include some or all of the following features. The vertical power loop structure may be a half-bridge structure with integrated decoupling capacitors. The vertical power loop structure may be a half-bridge structure without integrated decoupling capacitors. The vertical power loop structure may include a plurality of half-bridge structures each with one or more integrated decoupling capacitors. The vertical power loop structure may include a plurality of half-bridge structures each without an integrated decoupling capacitor. The thermal dissipation structure may include a plurality of insulated baseplates. The power module may include a plurality of vias for conduction layer interconnection. The power module may include conduction layer interconnection bonding technology. The power module may include a material with a high in-plane thermal spreading capability between the substrate bottom conduction layer and the thermal dissipation structure. The power module may further use lamination technology to reduce a stacked layer number of the vertical power loop structure. The lamination technology may include low-temperature co-fired ceramics (LTCC).

In an embodiment, a power module is provided. The power module includes: a vertical power loop structure configured to reduce loop stray inductance in the power module; and a plurality of insulated baseplates configured to provide electrical insulation and thermal dissipation for the power module.

Embodiment may include some or all of the following features. The vertical power loop structure may include a plurality of traces that go through a printed circuit board (PCB) inner layer of the vertical power loop structure to reduce a power loop area. The vertical power loop structure may include a substrate conduction layer. The plurality of insulated baseplates may be disposed between the substrate bottom conduction layer and a cooling structure. The vertical power loop structure may be a half-bridge structure. The vertical power loop structure may include, in parallel, a plurality of half-bridge structures each with one or more integrated decoupling capacitors. The power module may include a plurality of metal filled vias for conduction layer interconnection. The power module may include conduction layer interconnection bonding technology. The power module may include a material with a high in-plane thermal spreading capability between the substrate bottom conduction layer and the thermal dissipation structure.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings.

DETAILED DESCRIPTION

Figure 1:
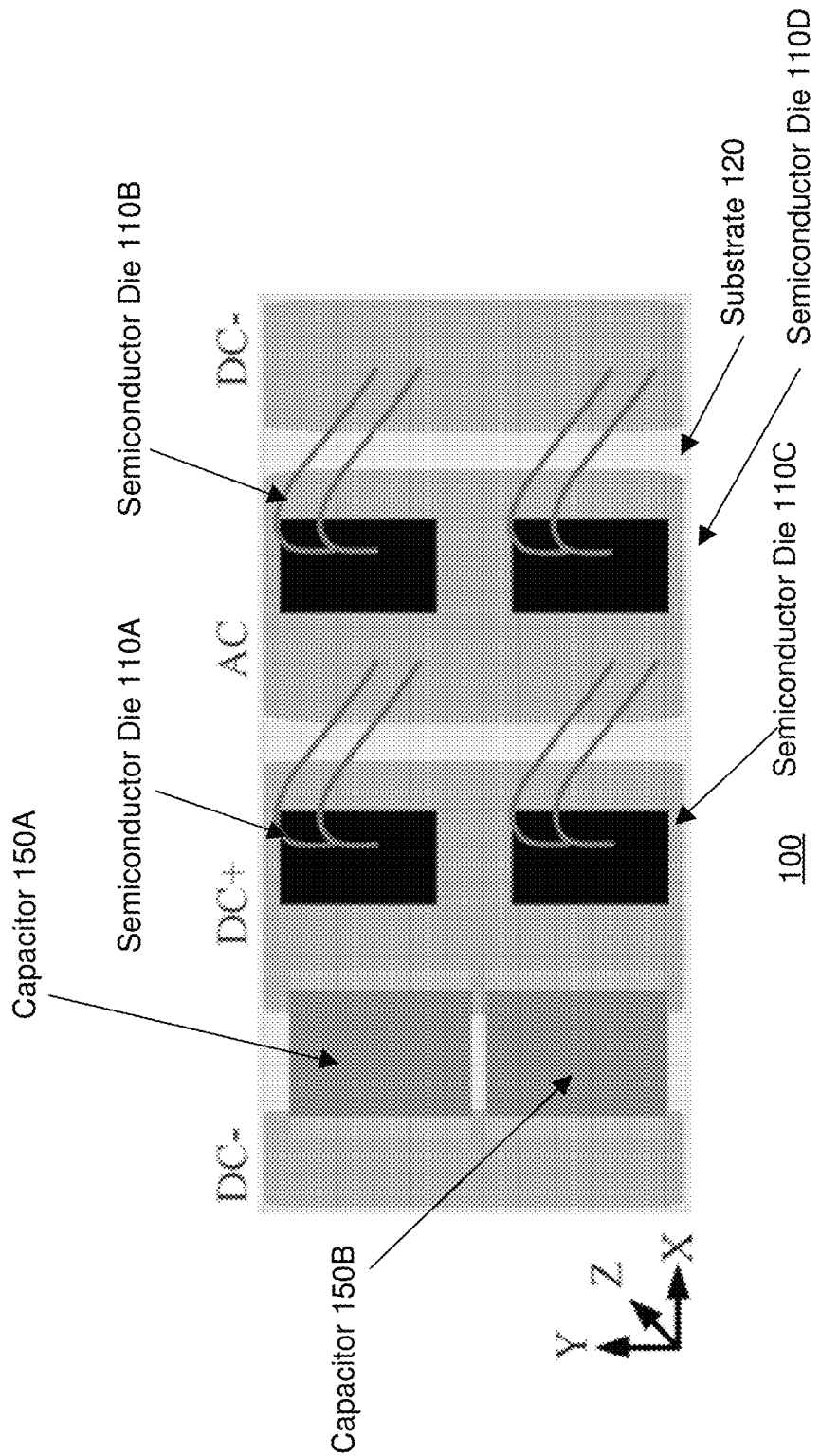
FIG. 1 is an illustration of top view of an example vertical power loop structure.

This description provides examples not intended to limit the scope of the appended claims. The figures generally indicate the features of the examples, where it is understood and appreciated that like reference numerals are used to refer to like elements. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein.

Figure 2:
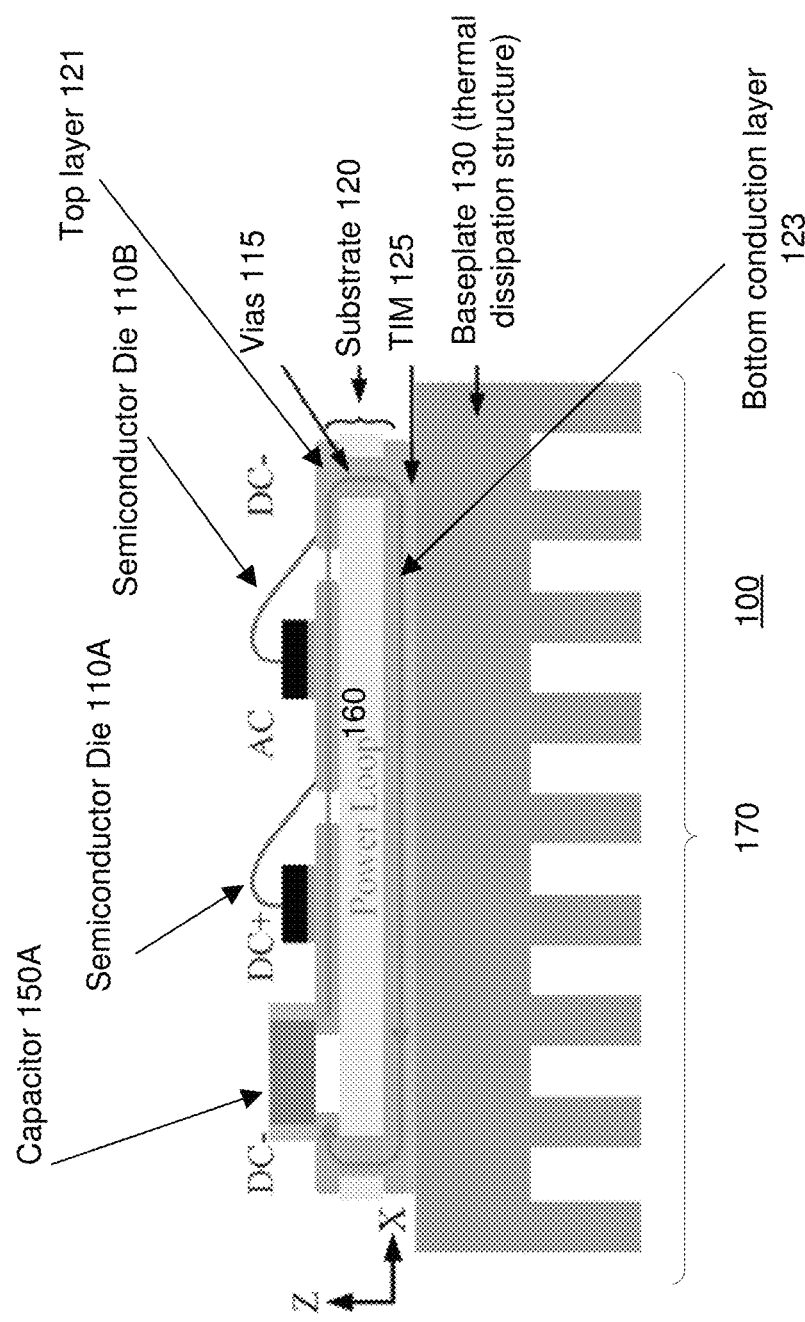
FIG. 2 is an illustration of a side view of the example vertical power loop structure.

FIG. 1 is an illustration of top view of an example vertical power loop structure 100. FIG. 2 is an illustration of a side view of the example vertical power loop structure 100. As shown in FIG. 1, the vertical power loop structure 100 is a half-bridge structure with a plurality of integrated decoupling capacitors 150 (i.e., the capacitors 150A and 150B) in a substrate 120. More or fewer capacitors 150 may supported. The capacitors may be connected in parallel and/or in series. In addition, the structure 100 includes a plurality of power semiconductor dies (i.e., the semiconductor dies 110A-110D). More or fewer semiconductor dies 110 may be supported.

In some embodiments, each vertical power loop structure 100 may include a plurality of half bridge structures with each half bridge structure connected in parallel. Each half bridge structure may include integrated capacitors or may not include integrated capacitors.

FIG. 2 is an illustration of a side view of the vertical power loop structure 100. As shown, the structure 100 may include the substrate 120 and a vertical power loop structure 160. The substrate 120 may have a top layer 121 and a bottom conduction layer 123. The top layer 121 and bottom conduction layer 123 may each be made from a material such as Cu. Other materials may be used. The bottom conduction layer 123 of the substrate 120 may be utilized as a negative DC bus for the structure 100. The bottom conduction layer 123 of the substrate 120 may be also utilized as other dc rails for the structure 100.

The substrate 120 may further have an attachment layer and an insulation layer. The attachment layer may be between 0.05 mm and 0.3 mm. The insulation layer may be between 0.254 mm and 1.1 mm. Other sizes may be supported.

The substrate 120 may further include a plurality of vias 115 that serve as an interconnection between the top layer 121 of the substrate 120 and the bottom conduction layer 123 of the substrate 120. The vias 115 may be filled with a material such as Cu. Other materials may be used. Due to low thermal conductivity of printed circuit boards (PCB), substrate materials such as DBC (direct bonding copper), DBA (direct bonding aluminum), and AMB (active metal brazing) are preferred.

The metal filled vias 115 may be used for conduction layer interconnection in the substrate 120. In some embodiments, bonding technology may be used for conduction layer interconnections in the substrate 120. A material with a high in-plane thermal spreading capability, such as graphene, may be used between the bottom conduction layer 123 and the baseplate 130. Other materials may be used. Lamination technology, such as low-temperature co-fired ceramics (LTCC), may be utilized to reduce a stacked layer number of the structure 120.

The vertical power loop structure 100 may further include a thermal interface material (TIM) layer or attachment layer 125. The layer 125 may be located between the bottom conduction layer 123 of the substrate 120 and a baseplate 130. The layer 125 may be made of a liquid metal material such as Gallium based alloys. The layer 125 may be attached using one or more of soldering, sintering, and brazing.

The vertical power loop structure 100 may be used to reduce overall loop stray inductance. The vertical loop structure 100 utilizes the bottom conduction layer 123 to form a complete power loop 160 in the structure 120. As a result, electrical insulation between the substrate bottom layer 123 copper and a cooling structure is needed. One example of such insulation is the baseplate 130.

The baseplate 130 may be an example of thermal dissipation structure and may be made from a variety of insulated materials such as ceramic or AlN. The baseplate 130 may include a plurality of fins 170 to help dissipate heat into a cooling structure. In some embodiments, the baseplate 130 may have a thickness (not including the fins 170) of between 3 mm and 5 mm. Each fin 170 may have a length of 3 mm to 15 mm. The cooling structure is described further with respect to FIG. 3.

Depending on the embodiment, there may be multiple baseplates 130 in the thermal dissipation structure. A lightweight baseplate 130 with good thermal conductivity is necessary for a high power-density power module design. The thermal dissipation capability and material density of common baseplate 130 materials are summarized in Table 1. Here, the term specific thermal conductivity is used, indicating the thermal dissipation capability per unit mass of the material. Cu, Al, and AlSiC are electrically conductive materials, and AlSiC shows the highest specific thermal conductivity. The rest in Table 1 are insulated ceramic materials. BeO has higher thermal conductivity than Al and AlSiC, and the specific thermal conductivity is 1.35 times that of AlSiC. AlN has similar thermal conductivity to Al and AlSiC. Thus, by replacing Al or AlSiC baseplates with AlN ones, the thermal dissipation capability of the baseplate will not be compromised. The comparison in Table I shows that AlN and BeO ceramic materials have similar or higher specific thermal conductivity than Cu, Al and AlSiC. Furthermore, the ceramic material can also provide electrical insulation between the power module internal electrical circuitry and a cooling structure. Since BeO powder may cause health issues to human body, AlN materials may be used in some embodiments. The insulated baseplate material may not be limited to the material listed in Table 1.

TABLE 1

| Material | Thermal Conductivity | Density | Specific Thermal Conductivity |
|---|---|---|---|
| Cu | 398 | 8.96 | 44.42 |
| Al-6061 | 167 | 2.7 | 61.85 |
| AlSiC-9 | 200 | 3.01 | 66.45 |
| $Al_2O_3$ (96%) | 24 | 3.95 | 6.07 |
| $Si_3N_4$ | 90 | 3.17 | 28.39 |
| AlN | 170 | 3.26 | 52.14 |
| BeO | 270 | 3.00 | 90 |

Figure 3:
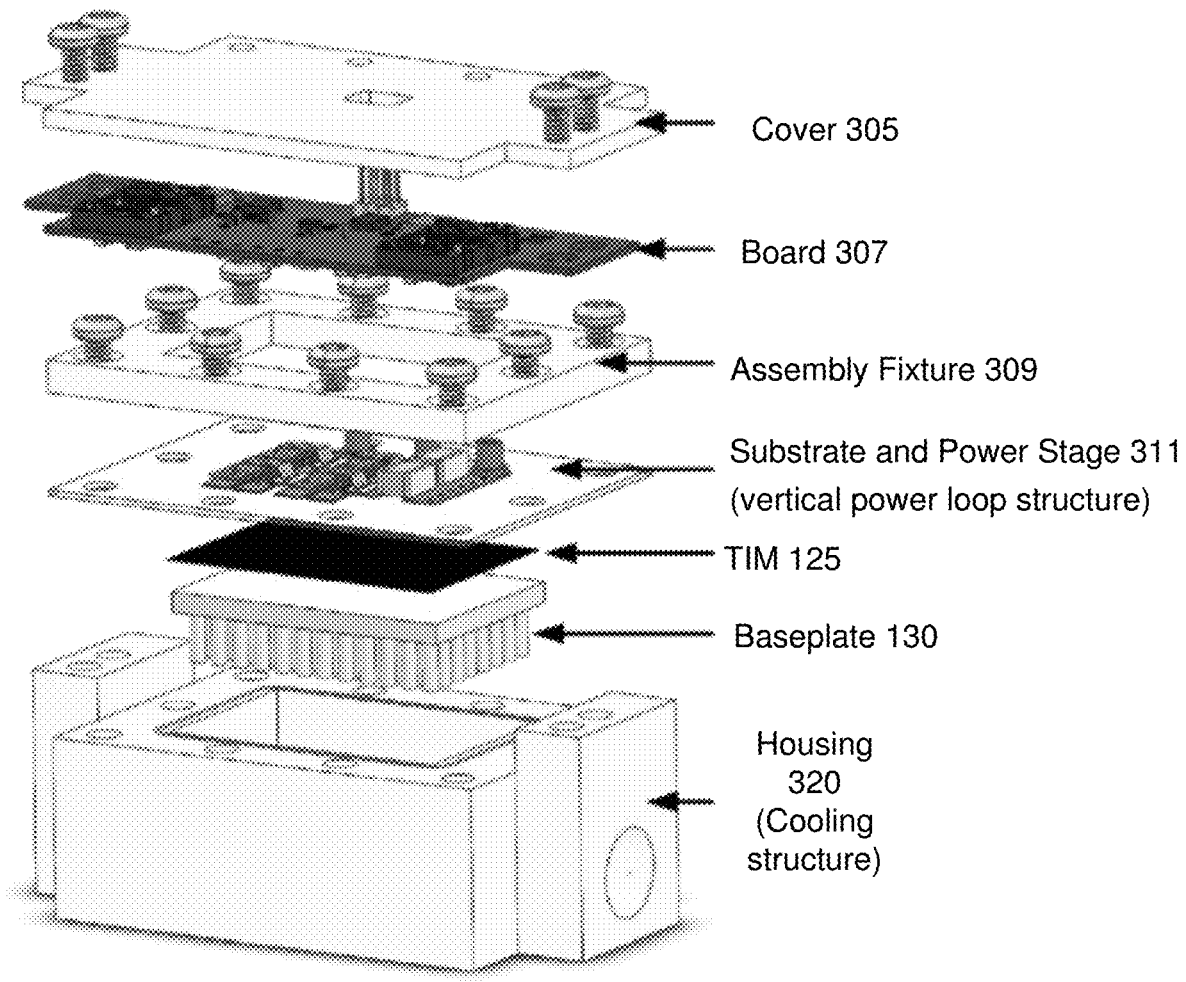
FIG. 3 is an illustration of an example power module assembly that includes the vertical power loop structure.

FIG. 3 is an illustration of an example power module assembly 300 that includes the vertical power loop structure 100. As shown, the structure 300 includes a cover 305, a board 307, an assembly fixture 309, a substrate and power stage 311, a TIM or attachment layer 125, a baseplate 130, and a housing 320.

The substrate and power stage 311, layer 125, and baseplate 130 may comprise the vertical power loop structure 100 described above with respect to FIGS. 1 and 2. The housing 320 may be configured to receive and protect the vertical power loop structure 100. In some embodiments, the housing 320 may be made from a material such as plastic and may be made using a 3D printing process. Other materials and manufacturing processes may be used.

The housing 320 may be an example of a cooling structure that is adapted to receive and cool the baseplate 130. The housing 320 may include a plurality of channels or holes through which the baseplate 130 may be cooled when the baseplate 130 is inserted into the housing 320.

The gate drive board 307 may include a gate drive that accepts input from a controller and is connected to the vertical power loop structure 100. The gate drive board 307 and the vertical power loop structure 100 may be secured in the housing 320 by the assembly fixture 309 and the cover 305. The assembly fixture 309 and the cover 305 may be made from the same material and/or process as the housing 320. Other materials and processes may be used.

One advantage of the vertical power loop structure 100 is the reduction of internal electric fields when compared to conventional structures. In particular, the vertical power loop structure 100 reduces internal electrical fields under both differential mode (DM) and common mode (CM) voltage excitation. For purposes of comparison, a conventional structure comprising both metal and ceramic baseplates was considered. The conventional structure included a substrate thickness of 0.635 mm and a copper thickness is 0.3 mm. The conventional structure further included a baseplate total height of 12 mm, a pin height of 9 mm, and a distance between the substrate top Cu traces of 1 mm. The conventional structure was designed for 1200 V SiC MOSFETs, so the DM excitation voltage was selected as 900 V. The CM excitation voltage was selected 2400 V according to standard IEC 60950. A comparison of electrical fields strengths for DM and CM voltages of the conventional structure and the vertical power loop structure 100 is shown below in Table 2.

TABLE 2

| Structure and Excitation | P1 [kV/mm] | P2 [kV/mm] |
|---|---|---|
| Conventional, DM 900 V | 1.55 | 1.38 |
| Conventional, CM 2400 V | 5.31 | 5.68 |
| Vertical Power Loop, DM 900 V | 2.53 | 2.44 |
| Vertical Power Loop, CM 2400 V | 1.59 | 1.50 |

Simulations of the vertical power loop structure 100 show that DM voltage isolation is provided by the substrate 120. The CM voltage is sustained by the baseplate 130. The decoupling of the substrate 120 and the baseplate 130 (due to the TIM 125) provides additional advantages to the vertical power loop structure 100 over the conventional structures. The thickness of the substrate layer 120 is determined by the maximum electric field strength under DM voltage. As can be seen in Table 2, the field strength of the vertical power loop 100 is approximately 50% less than the conventional structure. A lower field strength allows for thinner and less expensive material choices for the substrate 120 than can be used in conventional structures. Furthermore, the larger thickness of the baseplate 130 when compared to the substrate 120, further reduces the CM electrical field strength.

Another advantage of the vertical power loop structure 100 is a reduction in parasitic capacitance. Conventional power modules typically include a metal baseplate between the substrate and the TIM layer. Both the baseplate and the heatsink are made of metal, and the TIM layer is electrically conductive to provide better thermal conductivity between the baseplate and the heatsink. Because both the heatsink and the baseplate are grounded to each in conventional power modules, parasitic capacitances are distributed between top and bottom copper pads of a substrate of the conventional power modules.

Figure 4:
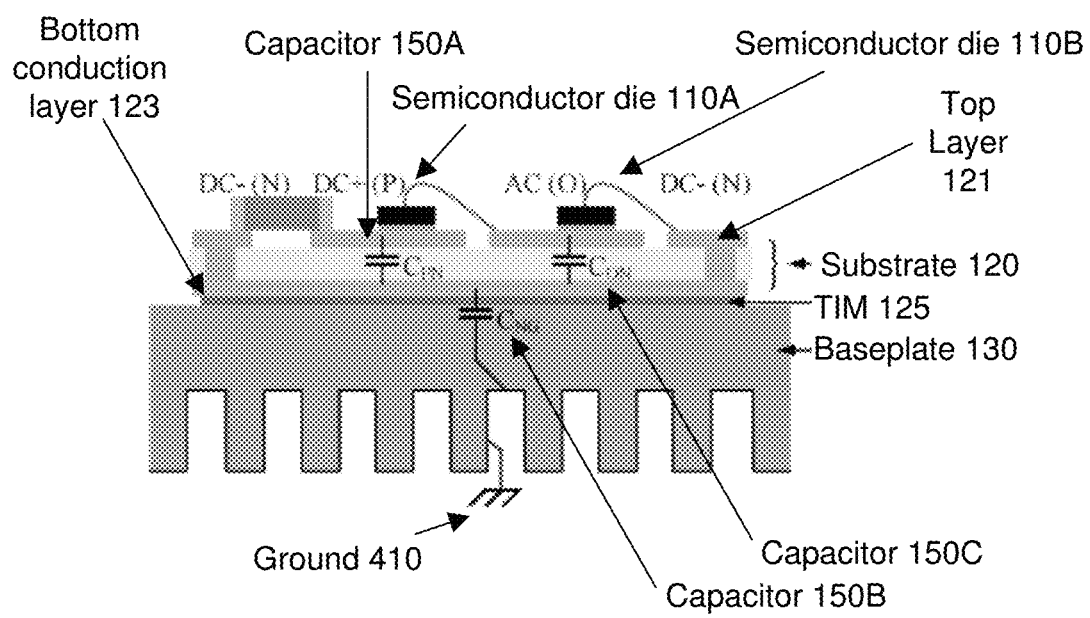
FIG. 4 is another illustration of a side view of the example vertical power loop structure.

In contrast, FIG. 4 illustrates how the vertical loop structure 100 reduces parasitic capacitance. In some embodiments, the baseplate 130 may be ceramic and insulated. The insulation forms a serial connected capacitance between the copper bottom conduction layer 123 and a ground 410. A current caused by the parasitic capacitance flows through the capacitors $C_{PN}$ (i.e., the capacitor 150A) and $C_{ON}$ (i.e., the capacitor 150C), through the $C_{PN}$ (i.e., the capacitor 150B), and into the ground 410.

Figure 5:
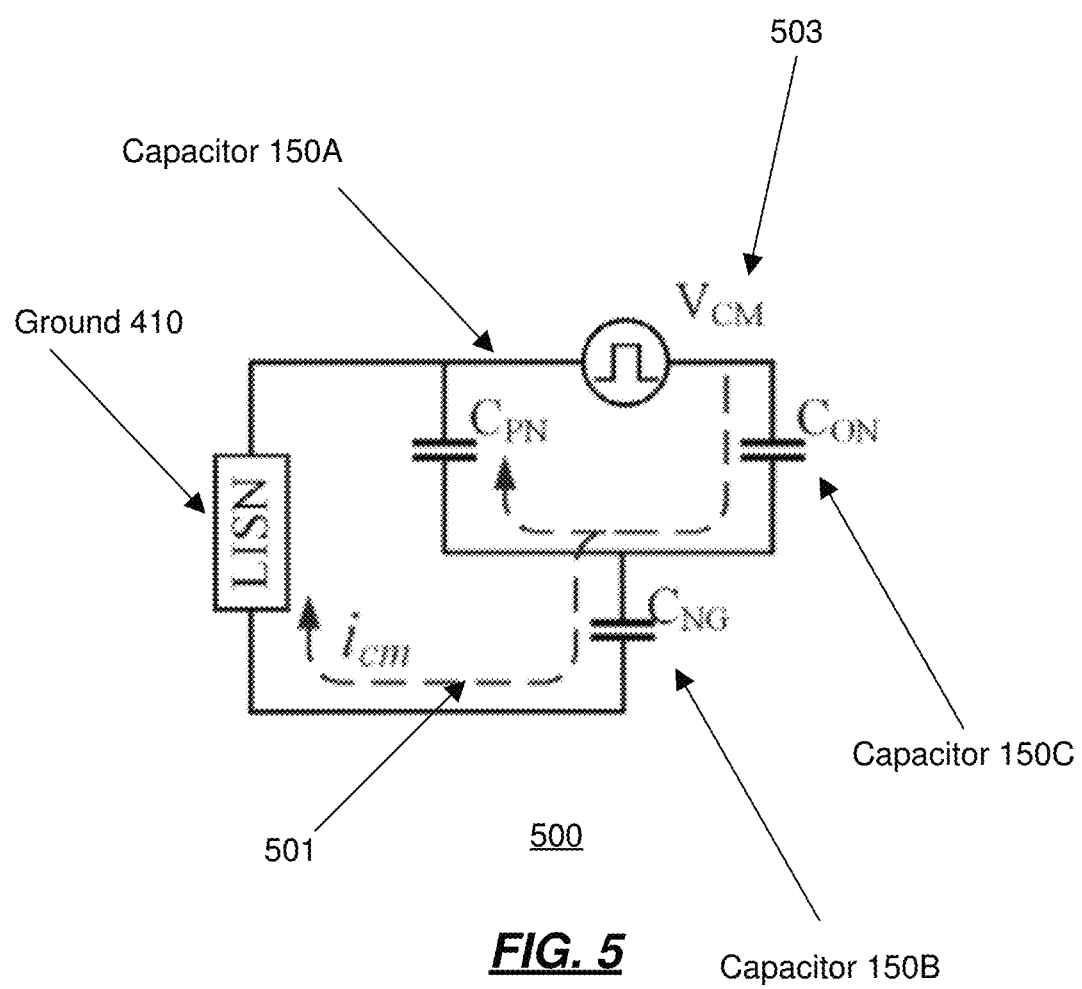
FIG. 5 is an illustration of an example circuit corresponding to the vertical loop structure.

FIG. 5 is an illustration of an example circuit 500 corresponding to the vertical loop structure 100. As shown, the current $i_{cm}$ (i.e., the current 501) flows into the circuit 500 due to to the applied voltage $V_{cm}$ (i.e., the voltage 503). The current 501 flows through the capacitors $C_{PN}$ and $C_{ON}$ (i.e., the capacitors 150A and 150C respectively) and then through the capacitor $C_{NG}$ (i.e., the capacitor 150B). The current 501 then exits through the ground 410.

Figure 6:
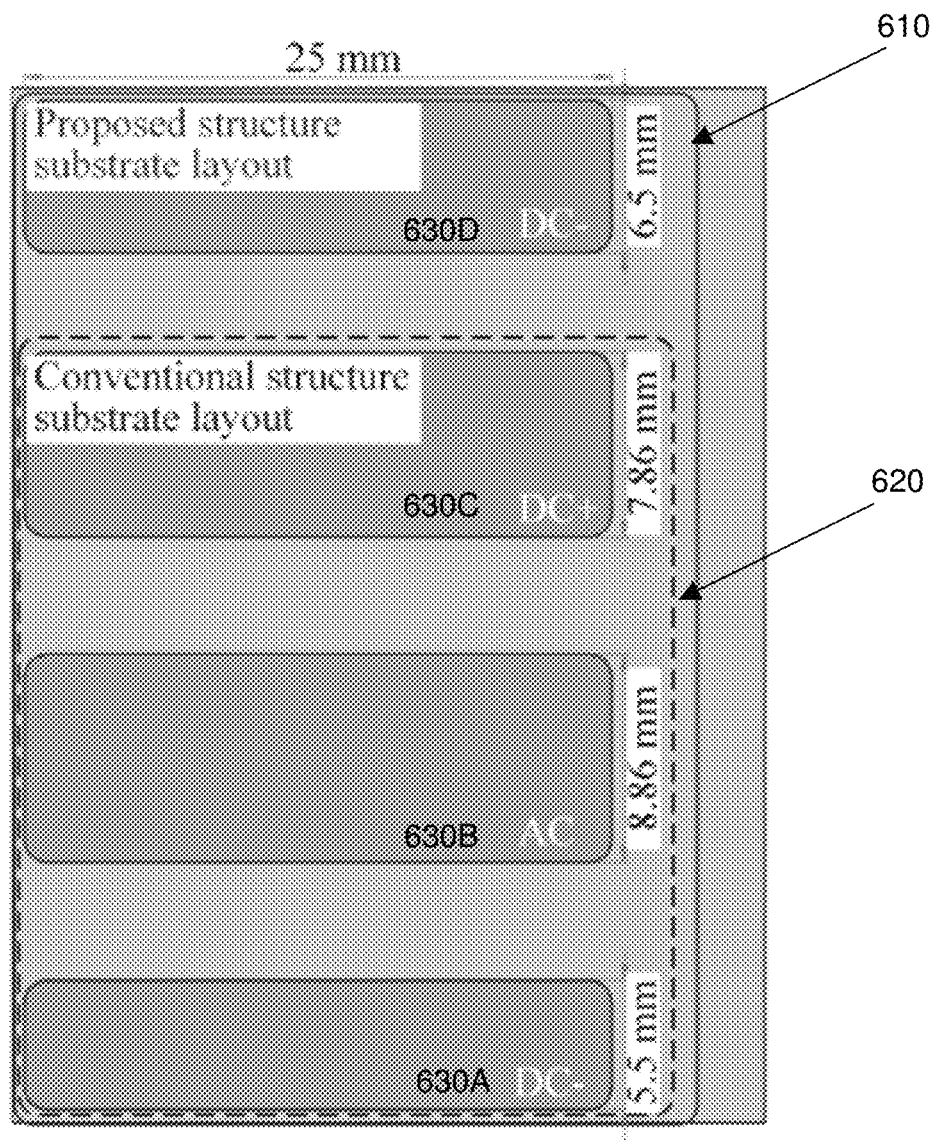
FIG. 6 is an illustration of a top view of an example layout of a substrate.

FIG. 6 is an illustration of a top view of an example layout of a substrate 120. The layout of a conventional substrate 120 is shown inside the dashed line 620, while the layout of the improved substrate 120 of the vertical power loop structure 100 is shown inside the solid line 610. The layout of the conventional substrate 120 includes the traces 630A, 630B, and 630C. The trace 630A is a negative DC trace, the trace 630B is an AC trace, and the trace 630C is a positive DC trace.

As shown, the layout of the improved substrate 120 of the vertical power loop structure 100 includes the traces 630A, 630B, and 630C, and an additional trace 630D. The trace 630D is a negative DC trace. The addition of the trace 630D forms the vertical power loop 160 of the substrate 120. In the example shown, the substrate 120 of the vertical loop structure is approximately 50 mm long and 34 mm wide. Other sized substrates may be used.

In some embodiments, each of the traces 630 may go through a PCB inner layer of the substrate 120. This may result in a reduction of an area of the power loop 160 in the substrate 120.

Figure 7:
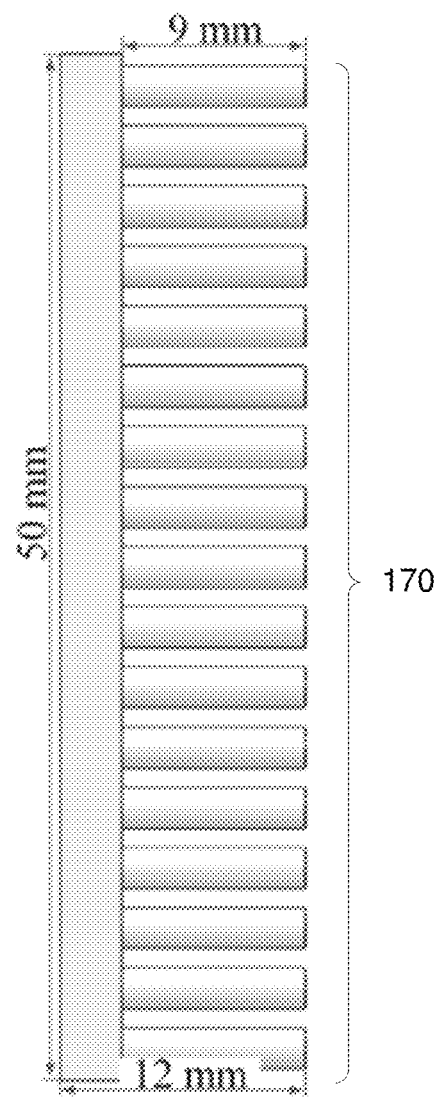
FIG. 7 is an illustration of a side view of example baseplate that may be used with the disclosed vertical loop structure.

FIG. 7 is an illustration of a side view of example baseplate 130 that may be used with the disclosed vertical loop structure 100. As shown, the baseplate 130 has a length of approximately 50 mm and a height of 12 mm. The baseplate 130 may also have a width of approximately 34 mm. In some embodiments, the dimensions of the baseplate 130 may match the dimensions of the substrate 120. The baseplate 130 further includes a plurality of fins 170. In the example shown, there are 17 fins and each fin has a length of approximately 9 mm.

As used herein, the singular form "a," "an," and "the" include plural references unless the context clearly dictates otherwise.

As used herein, the terms "can," "may," "optionally," "can optionally," and "may optionally" are used interchangeably and are meant to include cases in which the condition occurs as well as cases in which the condition does not occur.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed.

It should be understood that the various techniques described herein may be implemented in connection with hardware components or software components or, where appropriate, with a combination of both. Illustrative types of hardware components that can be used include Field-Programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc. The methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium where, when the program code is loaded into and executed by a machine, such as a computer, the machine becomes an apparatus for practicing the presently disclosed subject matter.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include personal computers, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A power module, comprising:
 a vertical power loop structure formed within a substrate comprising a substrate bottom negative DC conduction layer for electrical conduction, a substrate top negative DC conduction layer, and vias that provide an electrical interconnection between the substrate bottom negative DC conduction layer and the substrate top negative DC conduction layer;
 an AC trace disposed within the substrate;
 a positive DC trace disposed within the substrate;
 a cooling structure; and
 a thermal dissipation structure disposed between the substrate bottom negative DC conduction layer and the cooling structure.

2. The power module of claim 1, wherein the vertical power loop structure is a half-bridge structure with integrated decoupling capacitors.

3. The power module of claim 1, wherein the vertical power loop structure is a half-bridge structure without integrated decoupling capacitors.

4. The power module of claim 1, wherein the vertical power loop structure comprises a plurality of half-bridge structures each with one or more integrated decoupling capacitors.

5. The power module of claim 1, wherein the vertical power loop structure comprises a plurality of half-bridge structures each without an integrated decoupling capacitor.

6. The power module of claim 1, wherein the thermal dissipation structure comprises an insulated baseplate.

7. The power module of claim 1, further comprising conduction layer interconnection bonding technology.

8. The power module of claim 1, further comprising a material with a high in-plane thermal spreading capability between the substrate bottom conduction layer and the thermal dissipation structure.

9. The power module of claim 1, further comprising using lamination technology to reduce a stacked layer number of the vertical power loop structure.

10. The power module of claim 9, wherein the lamination technology comprises low-temperature co-fired ceramics (LTCC).

11. A power module comprising:
 a vertical power loop structure formed within a substrate having a substrate bottom negative DC conduction layer, a substrate top negative DC conduction layer, and vias that provide an electrical interconnection between the substrate bottom negative DC conduction layer and the substrate top negative DC conduction layer that is configured to reduce loop stray inductance in the power module;
 an AC trace disposed within the substrate;
 a positive DC trace disposed within the substrate; and
 an insulated baseplate configured to provide electrical insulation and thermal dissipation for the power module.

12. The power module of claim 11, wherein the vertical power loop structure comprises a plurality of traces that go through a printed circuit board (PCB) inner layer of the vertical power loop structure to reduce a power loop area.

13. The power module of claim 11, wherein the insulated baseplate is disposed between the substrate bottom conduction layer and a cooling structure.

14. The power module of claim 11, wherein the vertical power loop structure is a half-bridge structure.

15. The power module of claim 11, wherein the vertical power loop structure comprises, in parallel, a plurality of half-bridge structures each with one or more integrated decoupling capacitors.

16. The power module of claim 11, further comprising conduction layer interconnection bonding technology.

17. The power module of claim 11, further comprising a material with a high in-plane thermal spreading capability between the substrate bottom conduction layer and the thermal dissipation structure.

* * * * *